United States Patent
Kim et al.

(10) Patent No.: US 9,449,665 B1
(45) Date of Patent: Sep. 20, 2016

(54) SEMICONDUCTOR SYSTEMS AND SEMICONDUCTOR DEVICES

(71) Applicant: SK hynix Inc., Icheon-si Gyeonggi-do (KR)

(72) Inventors: Min Chang Kim, Seoul (KR); Chang Hyun Kim, Seoul (KR); Do Yun Lee, Yongin-si (KR); Jae Jin Lee, Gwangju-si (KR); Hun Sam Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/926,863

(22) Filed: Oct. 29, 2015

(30) Foreign Application Priority Data

Jul. 27, 2015  (KR) .................. 10-2015-0106089

(51) Int. Cl.
  *G11C 8/00*  (2006.01)
  *G11C 7/22*  (2006.01)
  *G11C 7/10*  (2006.01)
  *G11C 7/12*  (2006.01)

(52) U.S. Cl.
  CPC .............. *G11C 7/222* (2013.01); *G11C 7/106* (2013.01); *G11C 7/12* (2013.01)

(58) Field of Classification Search
  USPC .................. 365/233.1, 189.05, 233.13, 233.5
  See application file for complete search history.

(56) References Cited

U.S. PATENT DOCUMENTS

| 7,287,143 B2 * | 10/2007 | Lee ...................... G11C 7/1066 711/167 |
| 2002/0118575 A1 | 8/2002 | Sonoda et al. |
| 2007/0071074 A1 * | 3/2007 | Shin .................... G11C 7/1012 375/150 |
| 2012/0113728 A1 * | 5/2012 | Kwon ................. G11C 7/1006 365/189.05 |

FOREIGN PATENT DOCUMENTS

KR   1020070002803 A   1/2007

* cited by examiner

*Primary Examiner* — Vu Le
(74) *Attorney, Agent, or Firm* — William Park & Associates Ltd.

(57) ABSTRACT

A semiconductor system includes a first semiconductor device and a second semiconductor device. The first semiconductor device outputs data, a data strobe signal, an external command, and a clock signal. The second semiconductor device aligns the data in synchronization with the data strobe signal to generate first and second alignment data and latches the first and second alignment data to generate first and second latch data in response to a latch signal which is generated by dividing the data strobe signal.

20 Claims, 7 Drawing Sheets

SEMICONDUCTOR SYSTEMS AND SEMICONDUCTOR DEVICES

CROSS-REFERENCE TO RELATED APPLICATIONS

The present application claims priority under 35 U.S.C 119(a) to Korean Patent Application No. 10-2015-0106089, filed on Jul. 27, 2015, in the Korean Intellectual Property Office, which is incorporated herein by reference in its entirety as set forth in full.

BACKGROUND

1. Technical Field

Embodiments of the present disclosure relate to semiconductor devices and semiconductor systems.

2. Related Art

Efforts have been made in the development of semiconductor devices to have increased operation speeds and integration densities. For example, synchronous memory devices suitable for operating in synchronization with an external clock signal have been designed to improve operation speed.

Initially, single data rate (SDR) synchronous memory devices were proposed to enhance the operation speed of semiconductor memory devices. SDR synchronous memory devices receive or output the data in synchronization with rising edges of an external clock signal. Despite such advancements, high performance memory devices operating faster than the SDR synchronous memory devices are still needed for meeting the requirements of high-performance electronic systems.

As a response, double data rate (DDR) synchronous memory devices operating at a higher speed than SDR synchronous memory devices have been proposed. DDR synchronous memory devices may receive or output the data twice during a single cycle of an external clock signal. More particularly, DDR synchronous memory devices may receive or output the data in synchronization with rising edges as well as falling edges of the external clock signal. Thus, DDR synchronous memory devices may operate at a speed that is twice as high as that of SDR synchronous memory devices, even without an increase in the frequency of the external clock signal.

DDR synchronous memory devices may use a multi-bit pre-fetch scheme that internally processes multi-bit data at the same time. In the multi-bit pre-fetch scheme, multi-bit data that is input serially may be aligned in parallel in synchronization with a data strobe signal. The multi-bit data aligned in parallel may be simultaneously transmitted to memory cells by a write command signal.

Accordingly, what are needed are devices, systems, and methods that overcome these and other related deficiencies in the art.

SUMMARY

Various embodiments are directed to semiconductor devices and semiconductor systems.

According to an embodiment, a semiconductor system includes a first semiconductor device and a second semiconductor device. The first semiconductor device is suitable for outputting data, a data strobe signal, an external command, and a clock signal. The second semiconductor device is suitable for aligning the data in synchronization with the data strobe signal to generate first and second alignment data and suitable for latching the first and second alignment data to generate first and second latch data in response to a latch signal which is generated by dividing the data strobe signal.

According to an embodiment, a semiconductor device includes a latch data generating circuit and a clock synchronization circuit. The latch data generating circuit is suitable for generating first and second alignment data by aligning internal data in synchronization with a first internal strobe signal and a second internal strobe signal, and suitable for generating first and second latch data by latching the first and second alignment data in response to a latch signal which is generated by dividing the first internal strobe signal. The clock synchronization circuit is suitable for outputting an input clock from a write command and an internal clock and suitable for outputting the first and second latch data as first and second write data in response to the input clock.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
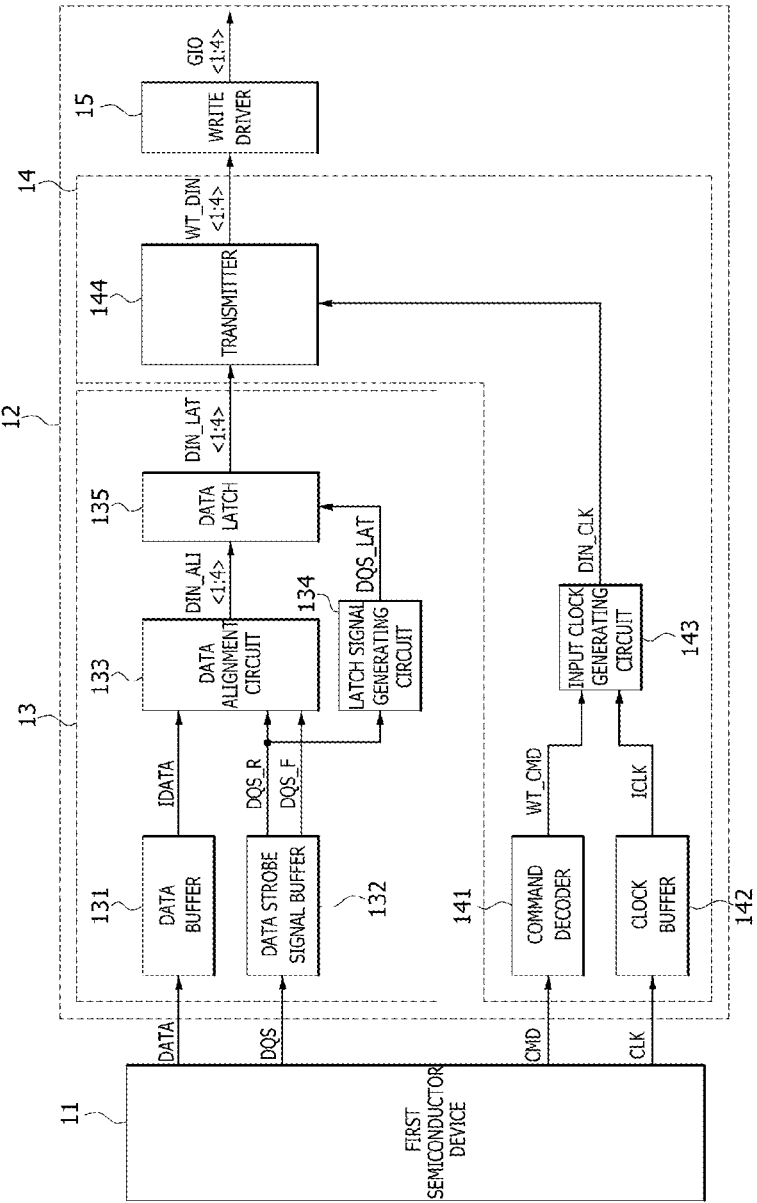
FIG. 1 is a block diagram illustrating an example of a configuration of a semiconductor system according to an exemplary embodiment.

As illustrated in FIG. 1, a semiconductor system according to an embodiment may include a first semiconductor device 11 and a second semiconductor device 12. The first semiconductor device 11 may apply data DATA, a data strobe signal DQS, an external command CMD, and a clock signal CLK to the second semiconductor device 12. The second semiconductor device 12 may include a latch data generating circuit 13, a clock synchronization circuit 14, and a write driver 15.

The latch data generating circuit 13 may include a data buffer 131, a data strobe signal buffer 132, a data alignment circuit 133, a latch signal generating circuit 134, and a data latch 135.

The data buffer 131 may buffer the data DATA to generate internal data IDATA. The data strobe signal buffer 132 may receive the data strobe signal DQS to generate a first internal strobe signal DQS_R and a second internal strobe signal DQS_F. The first internal strobe signal DQS_R may be generated in synchronization with a rising edge of the data strobe signal DQS. On the other hand, the second internal strobe signal DQS_F may be generated in synchronization with a falling edge of the data strobe signal DQS.

The data alignment circuit 133 may align the internal data IDATA in synchronization with the first internal strobe signal DQS_R and the second internal strobe signal DQS_F. Such alignment results in the generation of first to fourth alignment data DIN_ALI<1:4>. A configuration and an operation of the data alignment circuit 133 will be described later in detail with reference to FIG. 2.

The latch signal generating circuit 134 may generate a latch signal DQS_LAT from the first internal strobe signal DQS_R. The latch signal generating circuit 134 may divide the first internal strobe signal DQS_R to generate the latch signal DQS_LAT having a cycle which is twice that of the data strobe signal DQS. A configuration and an operation of the latch signal generating circuit 134 will be described later in detail with reference to FIG. 3 and FIG. 4.

The data latch 135 may latch the first to fourth alignment data DIN_ALI<1:4> in response to the latch signal DQS_LAT. Such latching results in the generation of the first to fourth latch data DIN_LAT<1:4>. Since the latch signal DQS_LAT has a cycle that is twice that of the data strobe signal DQS, each of the first to fourth latch data DIN_LAT<1:4> generated in synchronization with the latch signal DQS_LAT may also be generated to have a time period corresponding to two cycles of the data strobe signal DQS.

The clock synchronization circuit 14 may include a command decoder 141, a clock buffer 142, an input clock generating circuit 143, and a transmitter 144.

The command decoder 141 may decode the external command CMD to generate a write command WT_CMD for a write operation. The clock buffer 142 may buffer the clock signal CLK to generate an internal clock ICLK.

The input clock generating circuit 143 may generate an input clock DIN_CLK from the write command WT_CMD and the internal clock ICLK. If the write command WT_CMD is enabled, the input clock generating circuit 143 may latch the write command WT_CMD in synchronization with the internal clock ICLK. Also, the input clock generating circuit 143 may delay the latched write command WT_CMD according to write latency information and burst length information to generate the input clock DIN_CLK. A configuration and an operation of the input clock generating circuit 143 will be described later in detail with reference to FIG. 5.

The transmitter 144 may output the first to fourth latch data DIN_LAT<1:4> as first to fourth write data WT_DIN<1:4> in response to the input clock DIN_CLK. The write driver 15 may receive the first to fourth write data WT_DIN<1:4> to drive first to fourth global input/output (I/O) lines GIO<1:4>.

Figure 2:
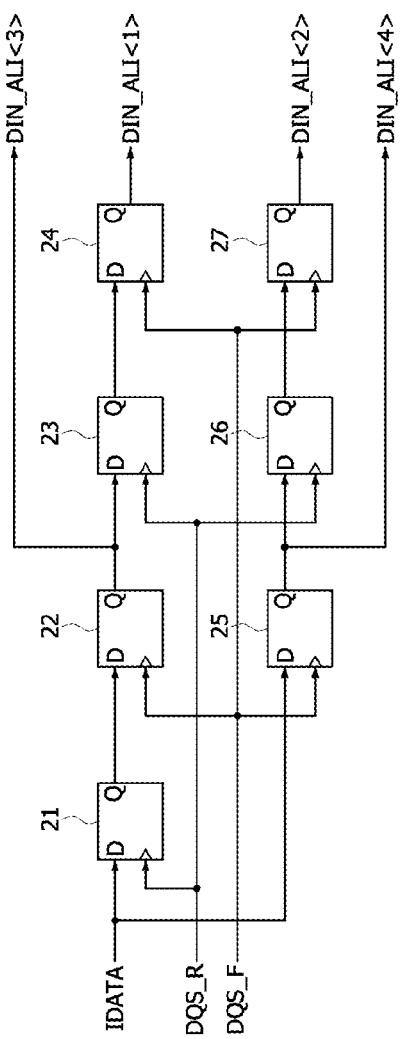
FIG. 2 is a block diagram illustrating an example of a configuration of a data alignment circuit which may be included in the semiconductor system of FIG. 1.

Referring to FIG. 2, the data alignment circuit 133 may include a plurality of latches, including a first latch 21, a second latch 22, a third latch 23, a fourth latch 24, a fifth latch 25, a sixth latch 26, and a seventh latch 27.

In more detail, the first latch 21 may latch the internal data IDATA in synchronization with the first internal strobe signal DQS_R to output the latched internal data IDATA. The second latch 22 may latch an output signal of the first latch 21 in synchronization with the second internal strobe signal DQS_F to generate the third alignment data DIN_ALI<3>. The third latch 23 may latch the third alignment data DIN_ALI<3> in synchronization with the first internal strobe signal DQS_R to output the latched third alignment data DIN_ALI<3>. The fourth latch 24 may latch an output signal of the third latch 23 in synchronization with the second internal strobe signal DQS_F to generate the first alignment data DIN_ALI<1>.

Further, the fifth latch 25 may latch the internal data IDATA in synchronization with the second internal strobe signal DQS_F to generate the fourth alignment data DIN_ALI<4>. The sixth latch 26 may latch the fourth alignment data DIN_ALI<4> in synchronization with the first internal strobe signal DQS_R to output the latched fourth alignment data DIN_ALI<4>. The seventh latch 27 may latch an output signal of the sixth latch 26 in synchronization with the second internal strobe signal DQS_F to generate the second alignment data DIN_ALI<2>.

As such, the data alignment circuit 133 having the aforementioned or similar configuration may output the first alignment data DIN_ALI<1>, the second alignment data DIN_ALI<2>, the third alignment data DIN_ALI<3>, and the fourth alignment data DIN_ALI<4> which are aligned in synchronization with the second internal strobe signal DQS_F. Each one of latches 21 through 27 may be or include a D-flip flop.

Figure 3:
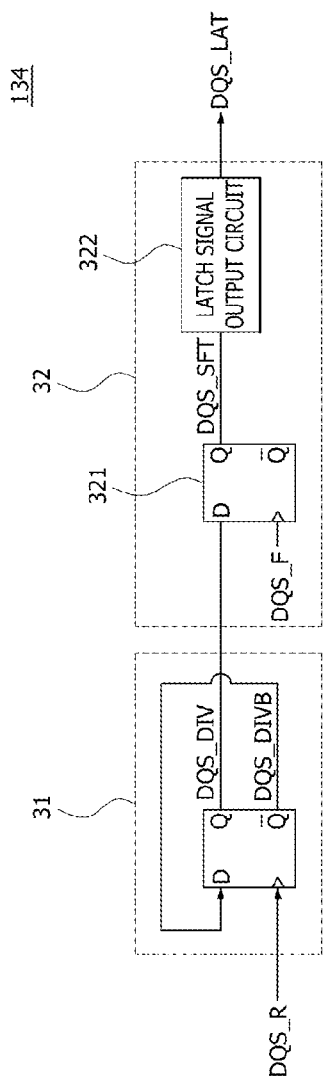
FIG. 3 is a block diagram illustrating a configuration of a latch signal generating circuit which may be included in the semiconductor system of FIG. 1.

Referring to FIG. 3, the latch signal generating circuit 134 may include a divider 31 and a signal delay circuit 32.

The divider 31 may divide the first internal strobe signal DQS_R to generate a divided signal DQS_DIV. The divider 31 may generate the divided signal DQS_DIV having a cycle which is twice that of the first internal strobe signal DQS_R. The divider 31 may be or include a D-flip flop. Further, the divider 31 may receive an inverted divided signal DQS_DIVB, which may be obtained by inverting the divided signal DQS_DIV, to generate the divided signal DQS_DIV in synchronization with the first internal strobe signal DQS_R.

More generally, the divider 31 may include or be realized using any one of various circuits that generate a divided signal DQS_DIV having a cycle which is N times that of the first internal strobe signal DQS_R, where N is a natural number greater than or equal to two.

The signal delay circuit 32 may be or include a divided signal shifting circuit 321 and a latch signal output circuit 322. The divided signal shifting circuit 321 may generate a shift signal DQS_SFT by shifting the divided signal DQS_DIV by a half cycle of the data strobe signal DQS in response to the second internal strobe signal DQS_F. The latch signal output circuit 322 may generate the latch signal DQS_LAT by delaying the shift signal DQS_SFT by a predetermined time period. The latch signal output circuit 322 may delay the shift signal DQS_SFT to output the delayed shift signal DQS_SFT as the latch signal DQS_LAT whose falling edge is located near a central point of the first to fourth alignment data DIN_ALI<1:4>.

Figure 4:
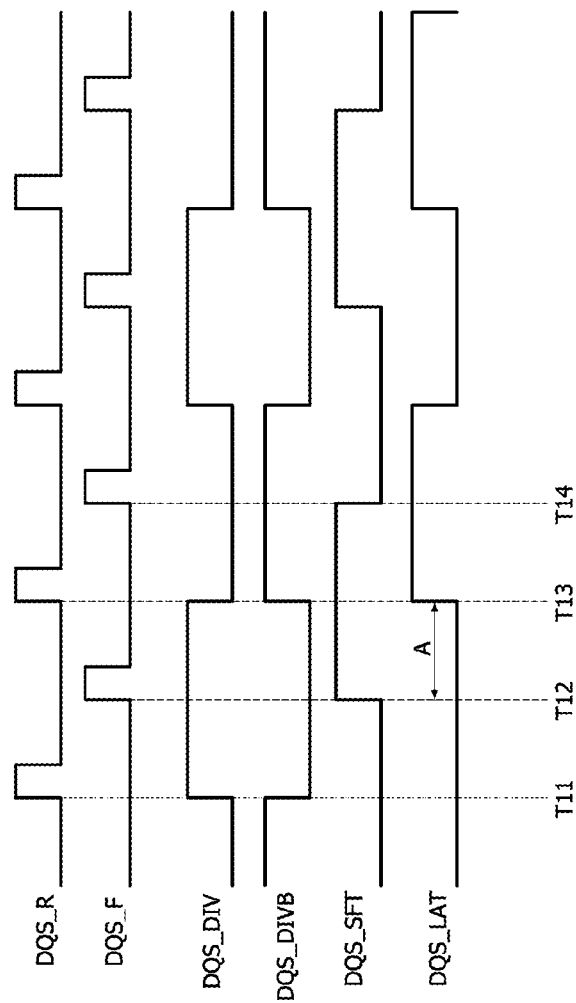
FIG. 4 is a timing diagram illustrating an example of an operation of the latch signal generating circuit shown in FIG. 3.

An operation of the latch signal generating circuit 134 illustrated in FIG. 3 will be described hereinafter with reference to FIG. 4.

First, before a time T11, the divided signal DQS_DIV and the inverted divided signal DQS_DIVB are initialized. For example, the divided signal DQS_DIV may be initialized to have a logic low level and the inverted divided signal DQS_DIVB may be initialized to have a logic high level.

At time T11, the divider 31 may receive the inverted divided signal DQS_DIVB, which is fed back, in synchronization with a first rising edge of the first internal strobe signal DQS_R. The divider 31 may then generate the divided signal DQS_DIV and the inverted divided signal DQS_DIVB.

In more detail, at time T11, the divider 31 may output the inverted divided signal DQS_DIVB as the divided signal DQS_DIV in synchronization with a rising edge of the first internal strobe signal DQS_R. Thus, at time T11, the divider 31 may receive the inverted divided signal DQS_DIVB having a logic high level, and generate the divided signal DQS_DIV having a logic high level.

In addition, the divider 31 may invert the inverted divided signal DQS_DIVB to generate the inverted divided signal DQS_DIVB having a different logic level. That is, at time T11, if the inverted divided signal DQS_DIVB having a logic high level is fed back to be inputted to the divider 31, the divider 31 may invert the inverted divided signal DQS_DIVB having a logic high level to output the inverted divided signal DQS_DIVB having a logic low level.

Subsequently, at a time T13, the divider 31 may receive the inverted divided signal DQS_DIVB having a logic low level which is fed back, in synchronization with a second rising edge of the first internal strobe signal DQS_R. The divider 31 may generate the divided signal DQS_DIV having a logic low level and the inverted divided signal DQS_DIVB having a logic high level. As such, the divider 31 may generate the divided signal DQS_DIV whose level is changed in synchronization with the rising edges of the first internal strobe signal DQS_R. Thus, the divider 31 may generate the divided signal DQS_DIV having a cycle that is twice that of the data strobe signal DQS.

At a time T12, the divided signal shifting circuit 321 may receive the divided signal DQS_DIV having a logic high level in synchronization with a first rising edge of the second internal strobe signal DQS_F to generate the shift signal DQS_SFT having a logic high level. In addition, at a point of time T14, the divided signal shifting circuit 321 may receive the divided signal DQS_DIV having a logic low level in synchronization with a second rising edge of the second internal strobe signal DQS_F to generate the shift signal DQS_SFT having a logic low level.

Thus, since the divided signal shifting circuit 321 output the divided signal DQS_DIV as the shift signal DQS_SFT in synchronization with the rising edges of the second internal strobe signal DQS_F, the shift signal DQS_SFT may correspond to a signal that the divided signal DQS_DIV is shifted by a half cycle of the data strobe signal DQS.

The latch signal output circuit 322 may generate the latch signal DQS_LAT by delaying the shift signal DQS_SFT by a time period "A". The latch signal output circuit 322 may set the time period "A" such that the falling edge of the latch signal DQS_LAT is located near the central point of the first to fourth alignment data DIN_ALI<1:4>.

Figure 5:
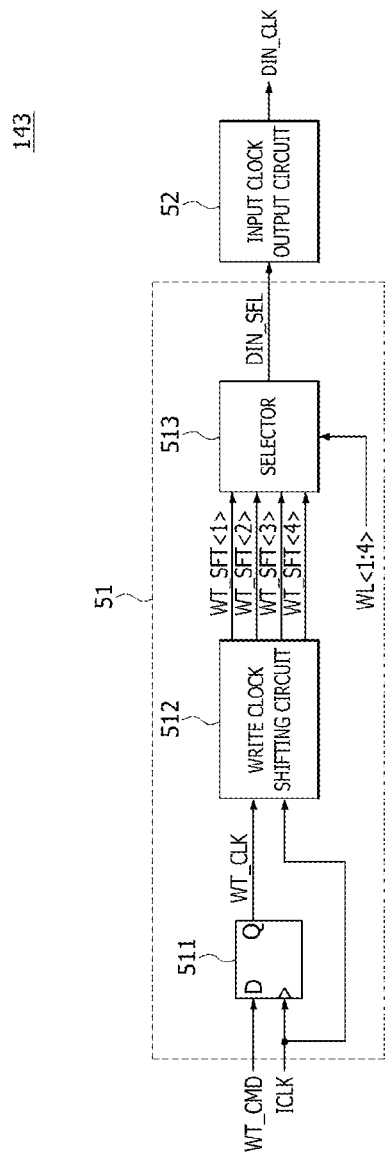
FIG. 5 is a block diagram illustrating an example of a configuration of an input clock generating circuit which may be included in the semiconductor system of FIG. 1.

Referring to FIG. 5, the input clock generating circuit 143 may include a selection clock generating circuit 51 and an input clock output circuit 52.

The selection clock generating circuit 51 may include a command latch 511, a write clock shifting circuit 512, and a selector 513.

The command latch 511 may latch the write command WT_CMD in response to the internal clock ICLK to generate a write clock WT_CLK.

The write clock shifting circuit 512 may generate the first to fourth shifting write clocks WT_SFT<1:4> by sequentially shifting the write clock WT_CLK. The write clock shifting circuit 512 may shift the write clock WT_CLK by a burst length time period, and to generate the first to fourth shifting write clocks WT_SFT<1:4>. The first through fourth shifting write clocks WT SFT<1:4> have write latencies which respectively correspond to one cycle to four cycles of the internal clock ICLK.

The selector 513 may select any one of the first to fourth shifting write clocks WT_SFT<1:4> to output the selected one as a selection clock DIN_SEL, in response to first to fourth write latency signals WL<1:4>.

More particularly, for example, if the write latency is set to one cycle of the internal clock ICLK and the first write latency signal WL<1> is enabled, the first shifting write clock WT_SFT<1> may be selected and outputted as the selection clock DIN_SEL. If the write latency is set to two cycles of the internal clock ICLK and the second write latency signal WL<2> is enabled, the second shifting write clock WT_SFT<2> may be selected and outputted as the selection clock DIN_SEL. If write latency is set to three cycles of the internal clock ICLK and the third write latency signal WL<3> is enabled, the third shifting write clock WT_SFT<3> may be selected and outputted as the selection clock DIN_SEL. Finally, if the write latency is set to four cycles of the internal clock ICLK and the fourth write latency signal WL<4> is enabled, the fourth shifting write clock WT_SFT<4> may be selected and outputted as the selection clock DIN_SEL.

The input clock output circuit 52 may generate the input clock DIN_CLK by delaying the selection clock DIN_SEL by a predetermined time period. The input clock output circuit 52 may delay the selection clock DIN_SEL to output the input clock DIN_CLK whose rising edge is located near the central point of first to fourth latch data DQS_LAT<1:4>.

Figure 6:
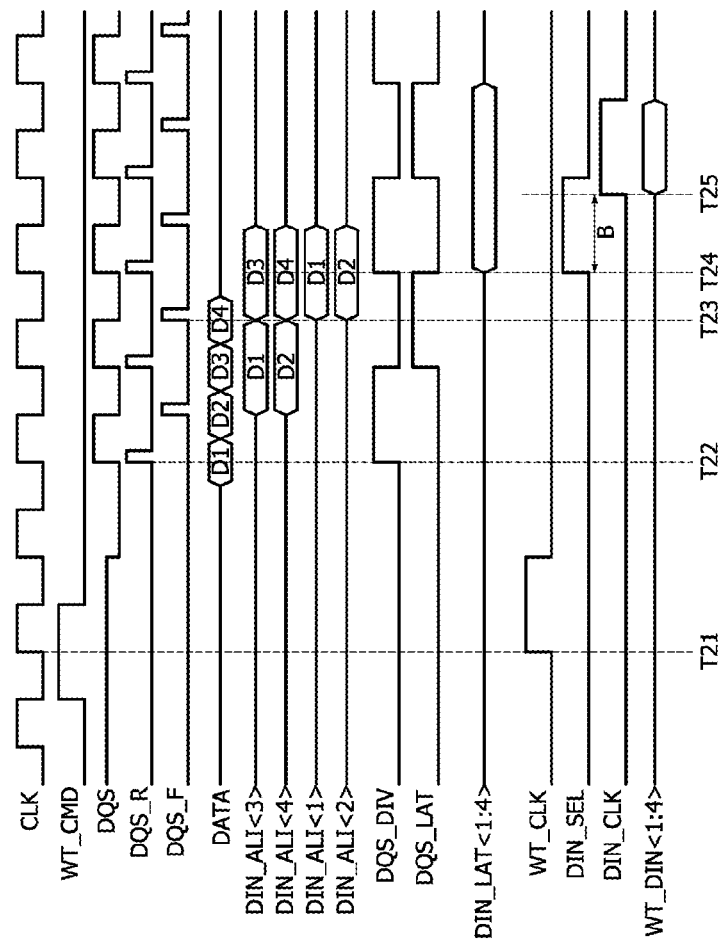
FIG. 6 is a timing diagram illustrating an example of an operation of semiconductor system illustrated in FIG. 1 to FIG. 5.

A write operation of the semiconductor system having aforementioned or similar configuration will be described hereinafter with reference to FIG. 6 in conjunction with an example in which the write latency is set to two cycles of the internal clock ICLK and the burst length is four.

First, if the write command WT_CMD is input at a point of time T21, the data strobe signal DQS may be generated to toggle from a time T22 that two cycles of the internal clock ICLK elapse after the time T21 and the data DATA may also be generated from the time T22.

The data strobe signal buffer 132 may generate the first internal strobe signal DQS_R in synchronization with the rising edges of the data strobe signal DQS. On the other hand, the data strobe signal buffer 132 may generate the second internal strobe signal DQS_F in synchronization with the falling edges of the data strobe signal DQS.

The data alignment circuit 133 may generate the first to fourth alignment data DIN_ALI<1:4> in synchronization with the first internal strobe signal DQS_R and the second internal strobe signal DQS_F. In an embodiment, the first through fourth alignment data DIN ALI<1:4> may have a time period width of approximately one cycle of the data strobe signal DQS at a time T23

The latch signal generating circuit 134 may divide the first internal strobe signal DQS_R to generate the divided signal DQS_DIV. Further, the latch signal generating circuit 134 may delay the divided signal DQS_DIV to generate the latch signal DQS_LAT.

The operation of generating the latch signal DQS_LAT from the first internal strobe signal DQS_R has been described above in relation to FIG. 4. Thus, a detailed description of the operation of generating the latch signal DQS_LAT from the first internal strobe signal DQS_R will be omitted hereinafter.

The data latch 135 may latch the first to fourth alignment data DIN_ALI<1:4> in synchronization with a falling edge of the latch signal DQS_LAT to generate the first to fourth latch data DIN_LAT<1:4>. In an embodiment, the first through fourth latch data DIM LAT<1:4> may have a time period of approximately two cycles of the data strobe signal DQS.

If the write command WT_CMD is input at time T21, the selection clock generating circuit 51 may generate the write clock WT_CLK, which is set to have a logic high level at time T21, in synchronization with the internal clock ICLK. Further, the selection clock generating circuit 51 may generate a selection clock DIN_SEL which is set to have a logic high level at a time T24 by shifting the write clock WT_CLK by four cycles (corresponding to a sum of the write latency (2) and a half of the burst length (4)) of the clock signal CLK. The input clock output circuit 52 may generate the input clock DIN_CLK by delaying the selection clock DIN_SEL by a time period "B". The input clock output circuit 52 may set the time period "B" such that a rising edge of the input clock DIN_CLK is located near a central point of the first to fourth latch data DIN_LAT<1:4>.

The transmission 144 may output the first to fourth latch data DIN_LAT<1:4> as the first to fourth write data WT_DIN<1:4> in synchronization with the rising edge of the input clock DIN_CLK at a point of time T25.

As described above, the semiconductor system according to an embodiment may realign the first to fourth alignment data DIN_ALI<1:4>, which are aligned in synchronization with the data strobe signal DQS. Such alignment may be performed in response to the latch signal DQS_LAT which is obtained by dividing the data strobe signal DQS. As a result, first to fourth latch data DIN_LAT<1:4> having a time period which is approximately two cycles of the data strobe signal DQS.

Since the first to fourth latch data DIN_LAT<1:4> having a time period of approximately two cycles of the input clock DIN_CLK generated from the clock signal CLK are transmitted to the write driver 15, the first to fourth alignment data DIN_ALI<1:4> may be stably transmitted to the write driver 15. Such stable transmission may be realized even if the cycles of the clock signal CLK and the data strobe signal DQS become shortened, e.g. according to speed improvement of the semiconductor system, timing of the clock signal CLK, and/or changes in the data strobe signal DQS from the ambient environment.

Note that the semiconductor device and the semiconductor system described with reference to FIGS. 1-6 may be embodied in an electronic system. The electronic system may be or include a memory system, a graphic system, a computing system, a mobile system, or the like. For example, an electronic system 1000 according an embodiment may include a data storage 1001, a memory controller 1002, a buffer memory 1003, and an I/O interface 1004.

The data storage 1001 may include the second semiconductor device 12 described above in relation to FIG. 1. The data storage 1001 may store data generated and communicated from the memory controller 1002. The data storage 1001 may output the stored data to the memory controller 1002, for example, in response to a control signal from the memory controller 1002.

The data storage 1001 may be or include a non-volatile memory that retains its stored data even when its power supply is interrupted. The non-volatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may include the first semiconductor device 11 described above in relation to FIG. 1 The memory controller 1002 may decode a command outputted from an external device (e.g., a host device) through the I/O interface 1004. Further, the memory controller 1002 may control data I/O from or to the data storage 1001 and the buffer memory 1003 according to the decoded result.

Figure 7:
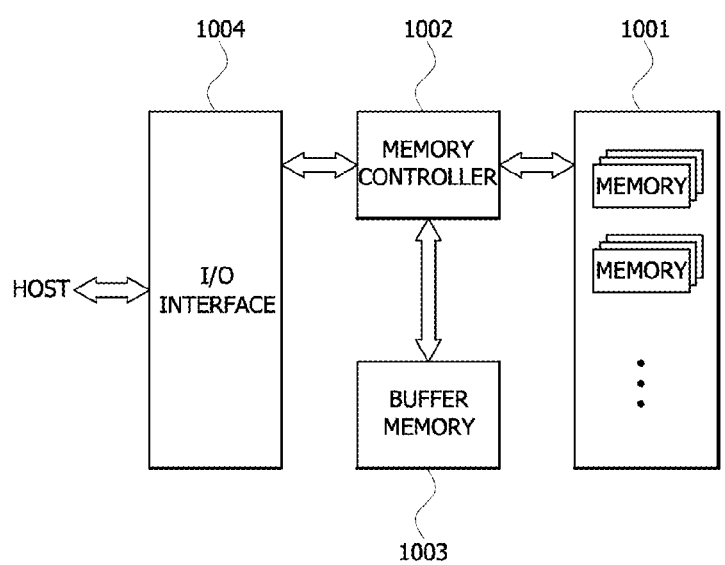
FIG. 7 is a block diagram illustrating an example of a configuration of an electronic system which may include the semiconductor system shown in FIG. 1 to FIG. 5.

Although FIG. 7 illustrates the memory controller 1002 with a single block, the memory controller 1002 may include one controller for controlling the data storage 1001 (e.g. comprised of a non-volatile memory) and another controller for controlling the buffer memory 1003 (e.g. comprised of a volatile memory).

The buffer memory 1003 may temporarily store the data (i.e. the data outputted, or inputted from or to, the data storage 1001) processed by the memory controller 1002. The buffer memory 1003 may store the data DATA outputted from the memory controller 1002, for example, in response to a control signal. The buffer memory 1003 may read and output the stored data to the memory controller 1002. The buffer memory 1003 may be or include a volatile memory such as a dynamic random access memory (DRAM), a mobile DRAM, or a static random access memory (SRAM).

The I/O interface 1004 may physically and electrically connect the memory controller 1002 to an external device (e.g., a host). Thus, the memory controller 1002 may receive control signals and data supplied from the external device (i.e., the host) through the I/O interface 1004. Further, the memory controller 1002 may output the data generated from the memory controller 1002 to the external device (i.e., the host) through the I/O interface 1004. That is, the electronic system 1000 may communicate with the host through the I/O interface 1004.

The I/O interface 1004 may be configured in accordance with any one of various suitable interface protocols, such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of a host device or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Various embodiments of the present disclosure have been disclosed above for illustrative purposes. Those of ordinary skill in the art will appreciate that various modifications, additions, and substitutions are available, without departing from the scope and spirit of the present disclosure as disclosed in the accompanying claims.

What is claimed is:

1. A semiconductor system comprising:
a first semiconductor device suitable for outputting data, a data strobe signal, an external command, and a clock signal; and
a second semiconductor device suitable for aligning the data in synchronization with the data strobe signal to generate first and second alignment data, and suitable for latching the first and second alignment data to generate first and second latch data in response to a latch signal which is generated by dividing the data strobe signal.

2. The semiconductor system of claim 1, wherein the second semiconductor device is suitable for generating the latch signal is generated to have a cycle which N times a cycle of the data strobe signal, where N is a natural number.

3. The semiconductor system of claim 1, wherein the second semiconductor device is suitable for generating the latch signal to have an edge that is located near a central point of the first and second alignment data.

4. The semiconductor system of claim 1, wherein the second semiconductor device includes:
a data alignment circuit suitable for aligning internal data obtained by buffering the data to generate the first and second alignment data, in response to a first internal strobe signal and a second internal strobe signal which are generated from the data strobe signal;
a latch signal generating circuit suitable for dividing the first internal strobe signal to generate the latch signal; and
a data latch suitable for latching the first and second alignment data in response to the latch signal to output the latched first and second alignment data as the first and second latch data.

5. The semiconductor system of claim 4, further comprising:
wherein the first internal strobe signal is generated in synchronization with a rising edge of the data strobe signal; and
wherein the second internal strobe signal is generated in synchronization with a falling edge of the data strobe signal.

6. The semiconductor system of claim 4, wherein the latch signal generating circuit includes:
a divider suitable for dividing the first internal strobe signal to generate a divided signal; and
a signal delay circuit suitable for delaying the divided signal to generate the latch signal.

7. The semiconductor system of claim 6, wherein the signal delay circuit includes:
a divided signal shifting circuit suitable for generating a shift signal by shifting the divided signal by a half cycle of the data strobe signal in response to the second internal strobe signal; and
a latch signal output circuit suitable for delaying the shift signal to output the latch signal.

8. The semiconductor system of claim 1, wherein the second semiconductor device is suitable for generating an input clock based on the external command and the clock signal, and suitable for outputting the first and second latch data as first and second write data in response to the input clock.

9. The semiconductor system of claim 8, wherein the second semiconductor device is suitable for generating the input clock having an edge that is located near a central point of the first and second latch data.

10. The semiconductor system of claim 8, wherein the second semiconductor device includes:
an input clock generating circuit suitable for generating the input clock in response to a write command generated by buffering the external command and an internal clock generated by buffering the clock signal; and
a transmitter suitable for outputting the first and second latch data as the first and second write data in response to the input clock.

11. The semiconductor system of claim 10, wherein the input clock generating circuit includes:
a selection clock generating circuit suitable for generating a selection clock by delaying the write command by a write latency and a burst length time period in response to the internal clock; and
an input clock output circuit suitable for outputting the input clock by delaying the selection clock.

12. The semiconductor system of claim 10, wherein the second semiconductor device further includes:
a write driver suitable for receiving the first and second write data to drive first and second input/output lines.

13. A semiconductor device comprising:
a latch data generating circuit suitable for generating first and second alignment data by aligning internal data in synchronization with a first internal strobe signal and a second internal strobe signal, and suitable for generating first and second latch data by latching the first and second alignment data in response to a latch signal which is generated by dividing the first internal strobe signal; and
a clock synchronization circuit suitable for generating an input clock from a write command and an internal clock, and suitable for outputting the first and second latch data as first and second write data in response to the input clock.

14. The semiconductor device of claim 13, wherein the latch data generating circuit is suitable for generating the latch signal to have a cycle which is N times a cycle of the data strobe signal, where N is a natural number.

15. The semiconductor device of claim 13, wherein the latch data generating circuit is suitable for generating a latch signal having an edge that is located near a central point of the first and second alignment data.

16. The semiconductor device of claim 13, wherein an edge of the input clock is located near a central point of the first and second latch data.

17. The semiconductor device of claim 13, wherein the latch data generating circuit includes:
a data alignment circuit suitable for aligning the internal data in synchronization with the first and second internal strobe signals to generate the first and second alignment data;
a latch signal generating circuit suitable for dividing the first internal strobe signal to generate the latch signal; and
a data latch suitable for latching the first and second alignment data in response to the latch signal to output the latched first and second alignment data as the first and second latch data.

18. The semiconductor device of claim 17, wherein the latch signal generating circuit includes:
a divider suitable for dividing the first internal strobe signal to generate a divided signal; and
a signal delay circuit suitable for delaying the divided signal to generate the latch signal.

19. The semiconductor device of claim 18, wherein the signal delay circuit includes:
a divided signal shifting circuit suitable for generating a shift signal by shifting the divided signal by a half cycle of the data strobe signal in response to the second internal strobe signal; and
a latch signal output circuit suitable for delaying the shift signal to output the latch signal.

20. The semiconductor device of claim 13, wherein the clock synchronization circuit includes:
   an input clock generating circuit suitable for generating the input clock in response to the write command and the internal clock; and
   a transmitter suitable for outputting the first and second latch data as the first and second write data in response to the input clock.

* * * * *